United States Patent
Byun et al.

(10) Patent No.: US 7,576,408 B2
(45) Date of Patent: Aug. 18, 2009

(54) FUSE BOX, METHOD OF FORMING A FUSE BOX, AND FUSE CUTTING METHOD

(75) Inventors: Gwang-Seon Byun, Gyeonggi-do (KR);
Jin-Sung Kim, Gyeonggi-do (KR);
Chang-Hyuk Ok, Gyeonggi-do (KR);
Jae-Ryong Jung, Gyeonggi-do (KR);
Hong-Shik Kim, Gyeonggi-do (KR);
Hee-Kyeong Jeon, Gyeonggi-do (KR);
Yong-Jun Min, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 396 days.

(21) Appl. No.: 11/559,759

(22) Filed: Nov. 14, 2006

(65) Prior Publication Data

US 2007/0115745 A1    May 24, 2007

(30) Foreign Application Priority Data

Nov. 18, 2005    (KR) .............. 10-2005-0110734

(51) Int. Cl.
*H01L 23/525* (2006.01)
(52) U.S. Cl. ...................... 257/529; 257/209
(58) Field of Classification Search ............... 257/529, 257/209, 530; 365/96, 225.7
See application file for complete search history.

(56) References Cited

U.S. PATENT DOCUMENTS

| | | | | |
|---|---|---|---|---|
| 5,986,321 | A | * 11/1999 | Froehner | ............ 257/529 |
| 6,541,290 | B1 | * 4/2003 | Bang et al. | ............ 438/22 |
| 2004/0245600 | A1 | 12/2004 | Kamiya | |
| 2006/0261437 | A1 | * 11/2006 | Maiz et al. | ............ 257/529 |

FOREIGN PATENT DOCUMENTS

| | | |
|---|---|---|
| JP | 2004-303991 | 10/2004 |
| KR | 2003-0058307 | 7/2003 |
| KR | 2004-0050663 | 6/2004 |
| KR | 10-2005-0003034 | 1/2005 |

OTHER PUBLICATIONS

English language abstract for Korean Publication No. 2003-0058307.
English language abstract for Korean Publication No. 2004-0050663.
English language abstract for Korean Publication No. 2004-303991.

* cited by examiner

*Primary Examiner*—Vu A Le
(74) *Attorney, Agent, or Firm*—Marger Johnson & McCollom, P.C.

(57) ABSTRACT

A fuse of a fuse box includes a fuse line with a plurality of sub-fuse lines. A fuse cutting method involves selectively cutting sub-fuse lines of a fuse line.

18 Claims, 7 Drawing Sheets

FUSE BOX, METHOD OF FORMING A FUSE BOX, AND FUSE CUTTING METHOD

CROSS-REFERENCE TO RELATED APPLICATION

This U.S. patent application claims priority to Korean Patent Application 2005-110734, filed Nov. 18, 2005, the disclosure of which is hereby incorporated herein by reference in its entirety.

BACKGROUND

1. Field of Invention

Embodiments exemplarily described herein relate to a fuse box and associated methods of cutting a fuse within a fuse box.

2. Description of the Related Art

Generally, during the fabrication of memory devices, when there is even one defective cell, a memory device cannot perform its function and is treated as a defective product. Accordingly, redundant cells are formed to replace the defective cell in order to improve throughput. Conventionally, spare rows and columns of redundancy cell are formed to replace defective cells in row and column. Specifically, after forming a memory device on a wafer level, a test is conducted to find defective memory cells and a program is run in an inner circuit to replace the addresses of the detected defective cells with the address signals of the spare cells. Accordingly, during actual use of the memory device when the address signals corresponding to the defective lines are inputted, the redundant cells are selected to replace the defective lines. One method of this program is to use a laser beam to blow and cut a fuse. The wiring that is disconnected by the laser beam emission is called a fuse line, and the region around the fuse line is called a fuse box.

Referring to FIGS. 1 through 5, a conventional fuse box and a conventional fuse cutting method using the fuse box will be described. The structure of the conventional fuse box is shown in FIGS. 1 and 2. FIG. 1 is a top plan view of a conventional fuse box, and FIG. 2 is a sectional view taken along line I-I' of FIG. 1. Referring to FIGS. 1 and 2, a first interlayer insulating layer 2 is disposed on a substrate 1. Metal wirings 3a and 3b are disposed on the first interlayer insulating layer 2 and the substrate 1. A second interlayer insulating layer 5 is disposed on the metal wirings 3a and 3b and the substrate 1 and fuse lines 9 are disposed on the second interlayer insulating layer 5. Each fuse line 9 is connected electrically to the metal wirings 3a and 3b through contact plugs 7a and 7b passing through the second interlayer insulating layer 5. A third interlayer insulating layer 11 and a passivation layer 13 are disposed on the fuse lines 9 and the second interlayer insulating layer 5. A fuse window 15 is defined within the passivation layer 13. The fuse window 15 exposes the fuse region of the fuse lines 9, and traverses the fuse lines 9. The fuse window 15 is formed to cut the fuse lines 9, and its width W1 is narrower than the length L of the fuse lines 9. Thus, in a conventional fuse box, the contact plugs 7a and 7b connected to the fuse lines 9 are not exposed through the fuse window 15, as shown in FIGS. 1 and 2. The problems that can arise in this conventionally-structured fuse box will now be described with reference to FIG. 3.

FIG. 3 is a sectional view showing fuse lines 9 cut with a laser beam 17 passing through a fuse window 15. Referring to FIG. 3, when a fuse line 9 is cut by the laser beam 17, cut portions 99 remain at the edges of the fuse window 15. The cut portions 99 of the fuse line 9 corrode when exposed to moisture in the air so that the volumes of the cut portions 99 expand. The expanding force is exerted vertically so that the third interlayer insulating layer 11, the passivation layer 13, or the second interlayer insulating layer 5 develops cracks ⓐ. The cracks act as moisture passages ① that accelerate absorption of moisture, which can adversely affect a device formed on the substrate 1 (e.g., a main memory device) in a drastic manner. Also, the cut portions 99, the contact plug 7a and 7b, and the metal wiring 3a and 3b of the fuse box structure provide two other second moisture passages ② passing therethrough. Additionally, when corroded, the cut portions 99 can become electrically connected with the adjacent fuse lines 9. Also in the above conventional fuse box, only one fuse region of the fuse lines 9 is exposed to the laser beam 17 through the fuse window. As a result, cutting defects can easily occur during actual manufacturing. This type of defect will be described further with reference to FIG. 5.

FIG. 4 is a sectional view of an exemplary conventional structure for preventing corrosion caused by moisture absorption and cracking. The width W2 of the fuse window 15 in this structure is greater than the length L of the fuse lines 9. Thus, the fuse lines 9 are completely exposed through the fuse window 15, whereby the passivation layer 13 is not disposed above the outer edge portion of the fuse lines 9. Accordingly, after the fuse line 9 is cut, even when corrosion occurs, the expanding caused by the corrosion is directed outward due to the lack of the passivation layer 13 thereon, thus reducing the occurrence of cracks.

However, as shown in FIG. 5, at least two moisture passages ③, similar to the moisture passages ② shown in FIG. 3, are formed during fuse cutting and a cutting defect ⓑ is generated. In particular, when the energy of the laser beam 17 for cutting the long fuse line 9 is applied too intensely, damage can be inflicted to the device itself. Because adequately adjusting the intensity of the beam is difficult, cutting defects can easily occur.

SUMMARY

Exemplary embodiments disclosed herein provide a fuse box, a forming method of a fuse box, and a cutting method of a fuse line for preventing the occurrence of cracks, cutting defects, bridges, and moisture penetration after a fuse line is cut.

One embodiment exemplarily disclosed herein provides a fuse box that includes: a first wiring and a second wiring formed on a substrate; at least one connecting pattern formed on the substrate; and a fuse line connecting the first wiring and the second wiring, the fuse line comprising a plurality of sub-fuse lines spaced apart from each other and electrically connected to each other by the at least one connecting pattern.

Another embodiment exemplarily disclosed herein provides a method of forming a fuse box that includes: forming a first wiring and a second wiring on a substrate; forming at least one connecting pattern on the substrate; and forming a fuse line connecting the first wiring and the second wiring, the fuse line comprising a plurality of sub-fuse lines spaced apart from each other and electrically connected to each other by the at least one connecting pattern.

Yet another embodiment exemplarily disclosed herein provides a method that includes providing a fuse box having a fuse line, at least one connecting pattern, and a fuse window exposing at least a portion of the fuse line, wherein the fuse line connects a first wiring and a second wiring and comprises a plurality of sub-fuse lines spaced apart from each other and electrically connected to each other by the at least one connecting pattern; and cutting at least a portion of at least one sub-fuse line.

BRIEF DESCRIPTION OF THE DRAWINGS

The accompanying drawings, which are included to provide a further understanding of the invention as recited in the claims and are incorporated in and constitute a part of this application, illustrate embodiment(s) of the claimed invention and together with the description serve to explain the principle(s) of the claimed invention. In the drawings:

DETAILED DESCRIPTION

Figure 1:
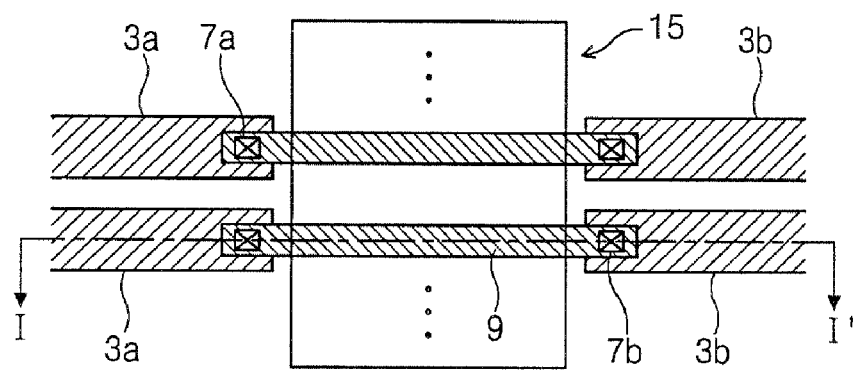
FIG. 1 is a plan view of a conventional fuse box.
Figure 2:
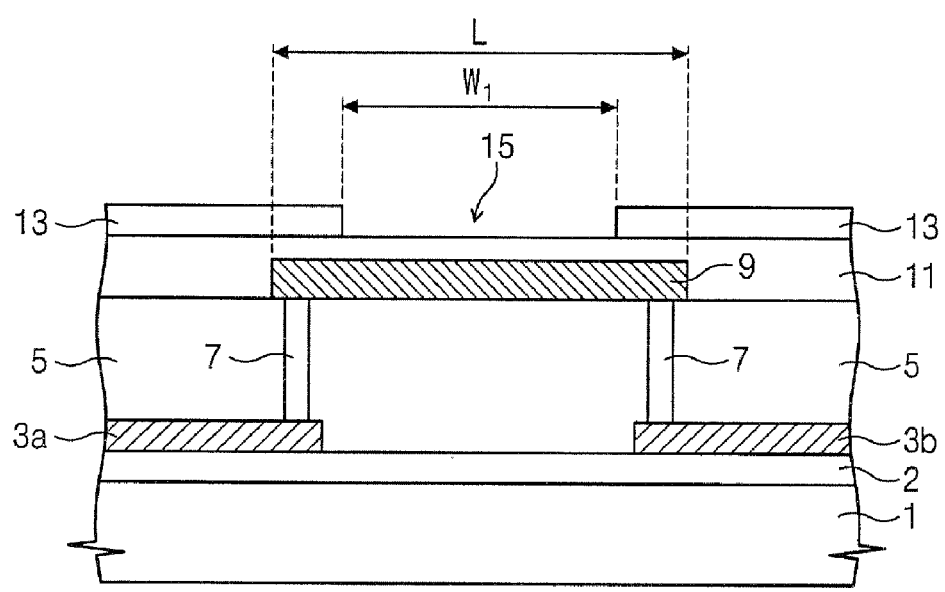
FIG. 2 is a sectional view taken along line I-I' of FIG. 1.
Figure 3:
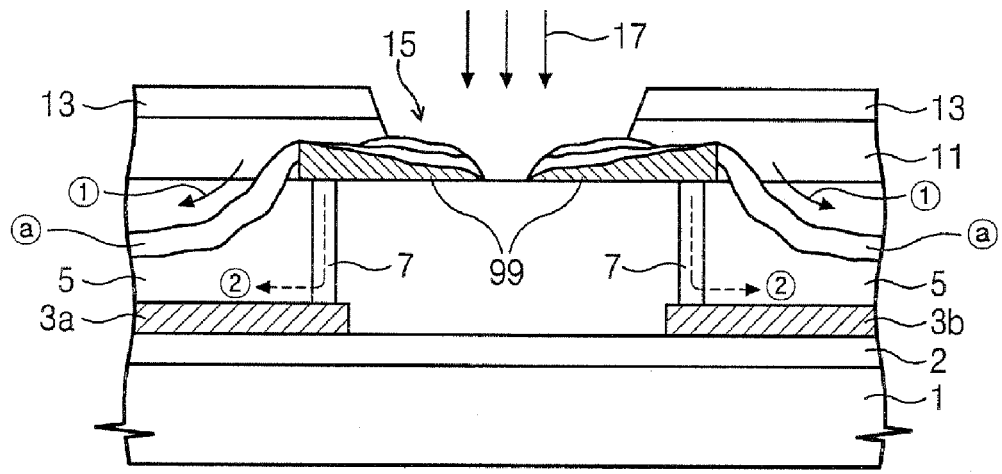
FIG. 3 is a sectional view showing fuse lines cut with a laser beam passing through a fuse window.
Figure 4:
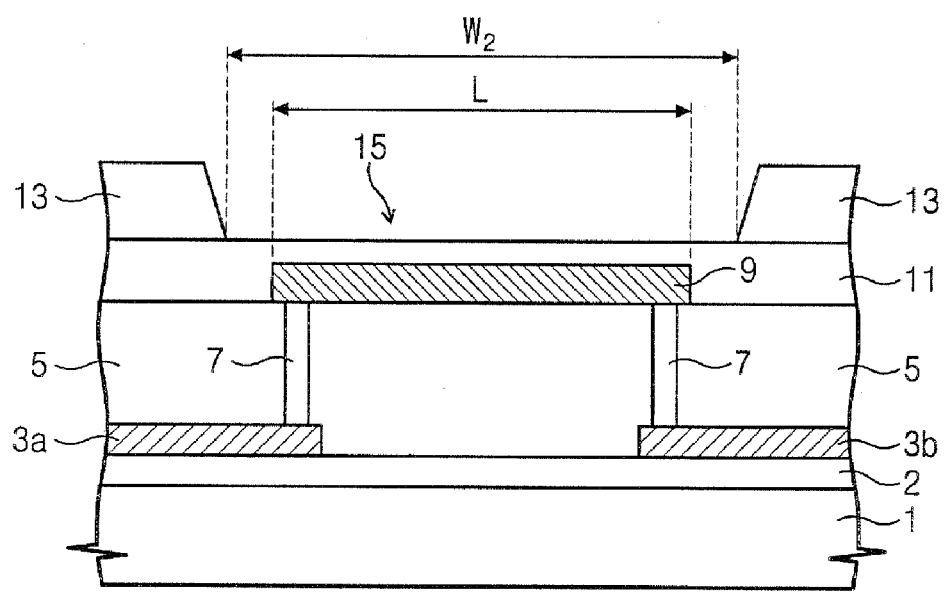
FIG. 4 is a sectional view of a conventional structure for preventing corrosion caused by moisture absorption and cracking.
Figure 5:
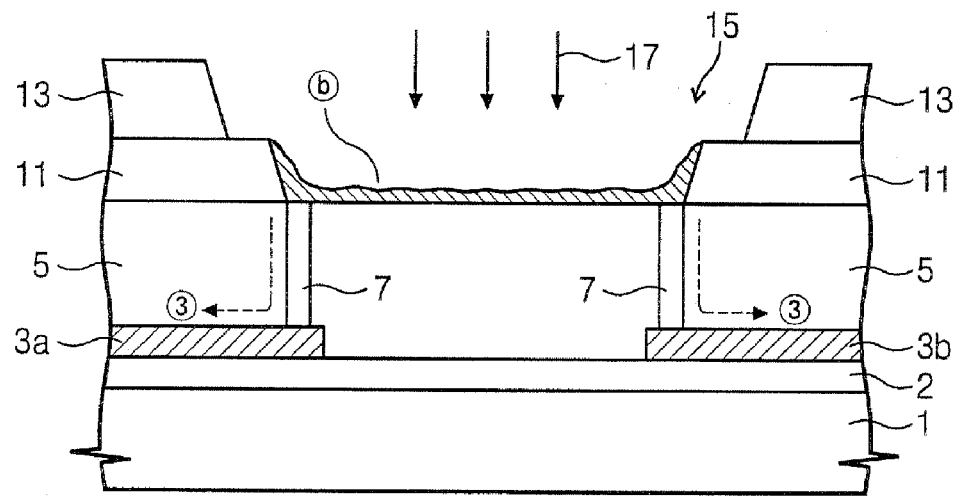
FIG. 5 is a sectional view showing the occurrence of a defect in the structure in FIG. 4.

Reference will now be made in detail to exemplary embodiments of the invention, examples of which are illustrated in the accompanying drawings. However, the claimed invention is not limited to the embodiments illustrated herein, and the embodiments described herein are rather introduced to provide easy and complete understanding of the scope and spirit of the claimed invention.

It will be understood that, although the terms first, second, third, and the like may be used herein to describe various layers, fuse lines, wirings, conductors, patterns, and the like, these layers, fuse lines, wirings, conductors, and patterns should not be limited by these terms. These terms are only used to distinguish one region from another region. Thus, a first region mentioned in one embodiment could be termed a second region in another embodiment without departing from the teachings of the embodiments described herein. It will be also understood that when a layer is referred to as being "on" another layer or substrate, it can be directly on the other layer or substrate, or intervening layers may also be present. In the drawings, the thicknesses of layers and regions are exaggerated for clarity.

In one embodiment, a fuse box may include a plurality of fuse lines. Each fuse line may electrically connect two wirings. In one embodiment, each fuse line may include a plurality of sub-fuse lines separated from one another. Sub-fuse lines of respective fuse lines may be electrically connected to each other. In one embodiment, the connection between sub-fuse lines and between a sub-fuse line and a wiring may be achieved through a local interconnection structure. In one embodiment, fuse line cutting may be performed by selectively cutting at least one of the plurality of sub-fuse lines.

Figure 6A:
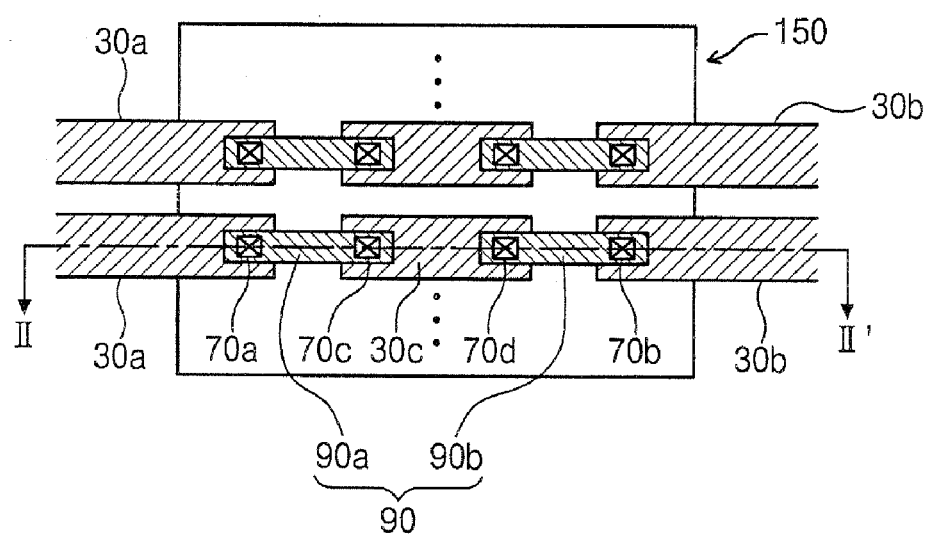
FIG. 6A is a plan view of one exemplary embodiment of a fuse box.
Figure 6B:
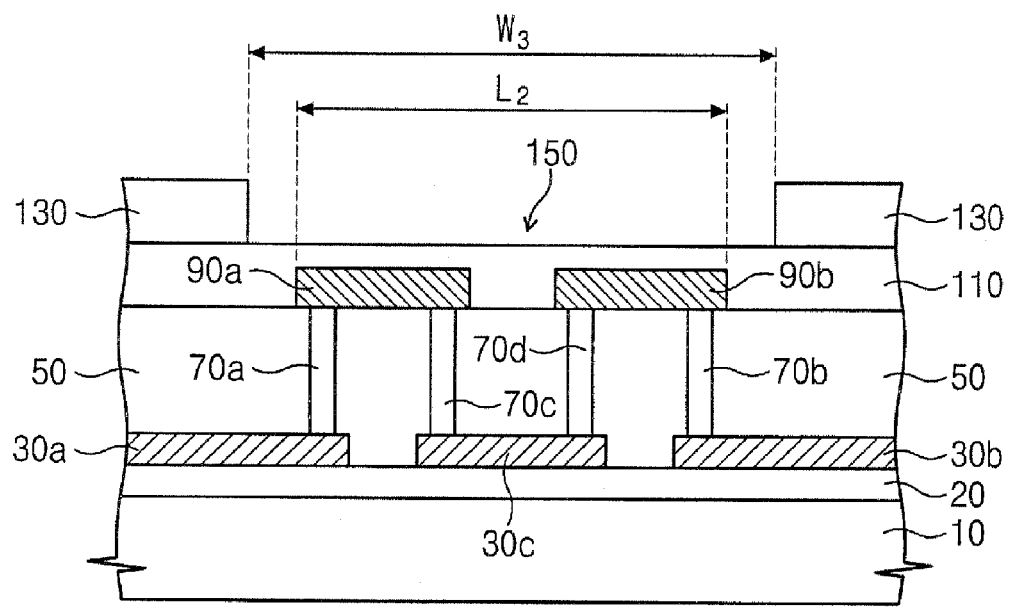
FIG. 6B is a sectional view taken along line II-II' of FIG. 6A.
Figure 7:
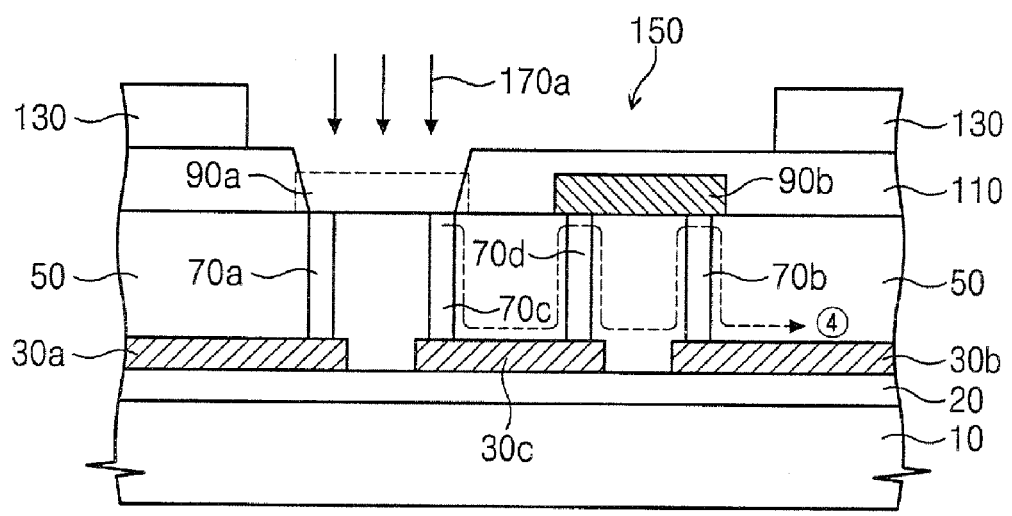
FIG. 7 is a sectional view showing a fuse cutting method of the fuse box in FIGS. 6A and 6B.
Figure 8:
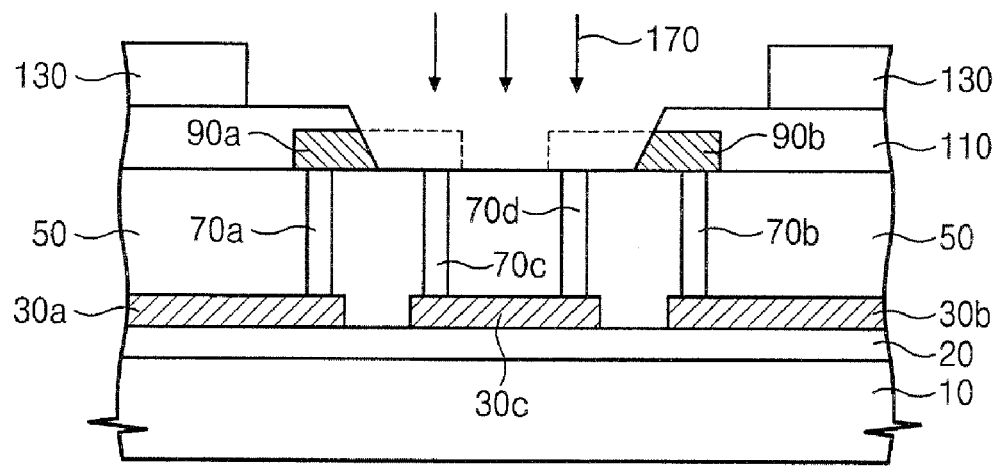
FIG. 8 is a sectional view showing another fuse cutting method of the fuse box in FIGS. 6A and 6B.

FIG. 6A is a plan view of one embodiment of a fuse box and FIG. 6B is a sectional view 6A taken along line II-II' of FIG. 6A (i.e., along the length of the fuse line). FIGS. 7 and 8 are sectional views showing exemplary fuse cutting methods of the fuse box in FIGS. 6A and 6B.

Referring to FIG. 6A, a fuse line 90 is electrically connected to first and second metal wirings 30a and 30b, respectively, and includes a plurality of sub-fuse lines. FIG. 6A shows two sub-fuse lines, e.g., first and second sub-fuse lines 90a and 90b, respectively. As exemplarily shown, the first sub-fuse line 90a is electrically connected to the first metal wiring 30a, and the sub-fuse line 90b is electrically connected to the second metal wiring 30b. The first and second sub-fuse lines 90a and 90b are also electrically connected to the connecting pattern 30c. A fuse window 150 is defined on the first and second sub-fuse lines 90a and 90b.

Referring to FIG. 6B, one embodiment of the vertical structure of the fuse box, including the connections between the sub-fuse lines and between the wirings and the sub-fuse lines, will be described in further detail. Referring to FIG. 6B, the fuse line 90 may be disposed on a second interlayer insulating layer 50 and may include the first sub-fuse line 90a and the second sub-fuse line, wherein the first and second sub-fuse lines 90a and 90b are separated from one another. Below the first and second sub-fuse lines 90a and 90b are the first wiring 30a and the second wiring 30b. The first sub-fuse line 90a is electrically connected to the first wiring 30a through a conductor 70a that passes through a predetermined region of the second interlayer insulating layer 50. The second sub-fuse line 90b is electrically connected to the second wiring 30b through a conductor 70b that passes through the second interlayer insulating layer 50. Also, a connecting pattern 30c may be disposed beneath and between the first sub-fuse line 90a and the second sub-fuse line 90b. The first and the second sub-fuse lines 90a and 90b are electrically connected to the connecting pattern 30c through conductors 70c and 70d, respectively, which pass through the second interlayer insulating layer 50. The first interlayer insulating layer 20 is disposed on the substrate 10. The first wiring 30a, the second wiring 30b, and the connecting pattern 30c may be disposed on the first interlayer insulating layer 20. The third interlayer insulating layer 110 and the passivation layer 130 may be disposed on the second interlayer insulating layer 50 as well as on the first and second sub-fuse lines 90a and 90b. The passivation layer has a fuse window 150 defined therein.

As exemplarily illustrated in FIG. 6B, the first wiring 30a, the second wiring 30b, and the connecting pattern 30c are formed on the same level (e.g., simultaneously formed in the same wiring process). Accordingly, the first wiring 30a, the second wiring 30b, and the connecting pattern 30c may be easily formed without any further processes and with using a multi-layer wiring process for highly integrated devices. In another embodiment, however, the first wiring 30a, the second wiring 30b, and the connecting pattern 30c may be formed at mutually different levels. That is, the first wiring 30a, the second wiring 30b, and the connecting pattern 30c may be located at different heights over the substrate 10 and/or formed in different wiring processes. For example, the first wiring 30a may be formed when a first level metal wiring is formed, the second wiring 30b may be formed when a second level metal wiring is formed, and the connecting pattern 30c may be formed when a third level metal wiring is formed. In one embodiment, the fuse lines 90 may be formed on the same level. In another embodiment, the first wiring 30a, the second wiring 30b, the connecting pattern 30c, and the sub-fuse lines 90a and 90b may be formed using a multi-layer wiring process including, for example, forming a thin layer of conductor such as aluminum, and performing photo-lithographic etching.

In one embodiment, the conductors 70a, 70b, 70c, and 70d may be formed by etching a predetermined region of the second interlayer insulating layer 50 to form a contact hole and filling the contact hole with a conductor such as tungsten. The filling of the conductor in the contact hole may be performed by filling the contact hole with a conductor and performing a planarizing etching such as CMP or etch back. In one embodiment, the fuse window 150 is defined within the passivation layer 130 to facilitate cutting the sub-fuse lines with a laser beam. The width W3 of the fuse window 150 may, for example, be greater than the length L2 of the fuse line 90. Thus, the first and second sub-fuse lines 90a and 90b may lie entirely within the fuse window 150. Here, the length L2 of the fuse line 90 indicates the longest distance from one end of the first sub-fuse line 90a to one end of the second sub-fuse line 90b. Accordingly, and as exemplarily illustrated, the conductor 70a connecting the first sub-fuse line 90a to the first wiring 30a and the conductor 70b connecting the second sub-fuse line 90b to the second wiring 30b may be located within the fuse window 150. It will be appreciated, however, that the conductors 70a and 70b may also be located outside of the fuse window 150. That is, the width W3 of the fuse window 150 may be less than the length L2 of the fuse line 90. Thus, portions of the first and second fuse lines 90a and 90b may lie outside the fuse window 150.

As shown in FIGS. 6A and 6B, fuse lines 90 may be formed of two sub-fuse lines. It will be appreciated, however, that fuse lines 90 may be formed of 3, 4, or more sub-fuse lines as exemplarily described below with reference to FIGS. 10 and 11.

FIGS. 7 and 8 illustrate exemplary fuse cutting methods applied to the fuse box shown in FIGS. 6A and 6B. First, with reference to FIG. 7, the first sub-fuse line 90a is cut by emitting light from a laser beam 170a. Accordingly, the length of the moisture passage ④ formed by the fuse cutting is substantially longer than moisture passages ①, ②, or ③ shown in FIGS. 1 through 5. As a result, the effect of moisture on semiconductor devices formed on the substrate 10 shown in FIG. 7 can be minimized. Additionally, fuses can be cut from the fuse box shown in FIG. 7 while avoiding fuse cutting defects and other related problems. For example, if the first sub-fuse line 90a is not completely cut by the laser beam 170a, a further emitting of the laser beam on the first sub-fuse line 90a need not be performed to cut the fuse line 90. Rather, light from the laser beam 170a can be emitted onto the second sub-fuse line 90b. In the conventional fuse box shown in FIGS. 1 through 5, when a cutting defect occurs within the fuse line, light can only be re-emitted from the laser beam 170a on the same region and repeated emissions of the laser beam on the same region can damage layers underlying that region. Also, if the first sub-fuse line 90a is completely cut by the laser beam 170a, the second sub-fuse line 90b can remain covered by the third interlayer insulating layer 110 so that it is not exposed to damage incurred by moisture.

Another fuse cutting method involves simultaneously cutting two sub-fuse lines 90a and 90b. For example, a respective portion of the two sub-fuse lines 90a and 90b (that is, the portions facing each other) can be cut at the same time, as shown in FIG. 8. Accordingly, the cutting efficiency is greater compared to cutting just one sub-fuse line at a time, and cutting defects can be prevented.

Figure 9:
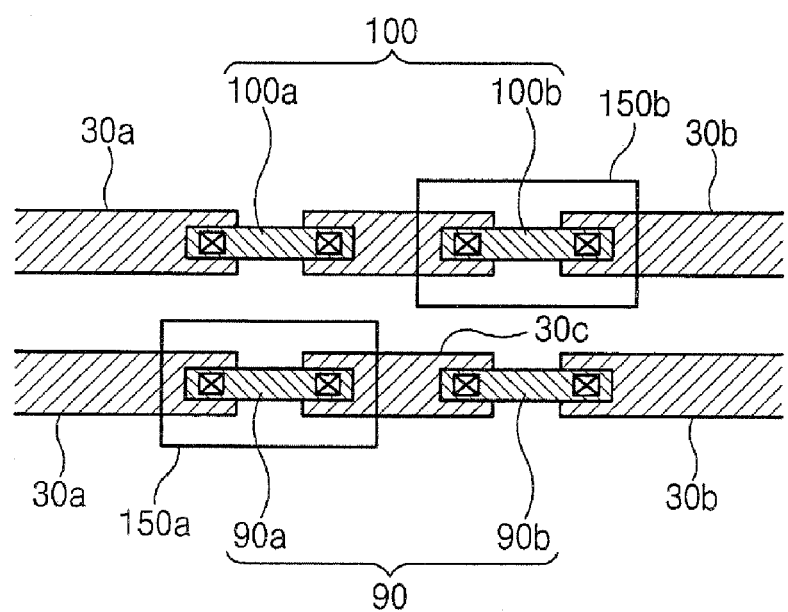
FIG. 9 is a plan view of another exemplary embodiment of a fuse box.

FIG. 9 is a plan view showing another embodiment of a fuse box. As shown in FIG. 9, the fuse box includes a plurality of fuse lines constructed as exemplarily described above with respect to FIGS. 6A and 6B and further includes a plurality of spaced-apart fuse windows 150a and 150b, wherein each fuse window is disposed above a different fuse line. In order to minimize the effects of cutting adjacent fuses, the neighboring fuse windows may be spaced as far apart as possible. Referring to FIG. 9, the fuse box includes first and second fuse lines 90 and 100, respectively. The first fuse line 90 includes a first sub-fuse line 90a and a second sub-fuse line 90b and the second fuse line 100 includes a first sub-fuse line 100a and a second sub-fuse line 100b. The first fuse window 150a (e.g., for cutting the first fuse line 90) may be formed above the first sub-fuse line 90a of the first fuse line 90, and the second fuse window 150b (e.g., for cutting the second fuse line 100) may be formed above the second sub-fuse line 100b of the second fuse line 100. Thus, in order to maximize the distance between cutting portions of the fuses, the first and second fuse windows 150a and 150b may be diagonally disposed over the substrate 10. When the first and second fuse windows 150a and 150b are diagonally disposed over the substrate 10, only one of adjacent sub-fuse lines in neighboring fuse lines 90 and 100 is disposed within a fuse window. For example, the first sub-fuse line 90a is disposed within the first fuse window 150a and the first sub-fuse line 100a is not disposed within a fuse window. Similarly, the second sub-fuse line 100b is disposed within the second fuse window 150b and the second sub-fuse line 90a is not disposed within a fuse window. Stated another way, the first fuse window 150a may be formed proximal to the first wiring 30a and the second fuse window 150b may be formed proximal to the second wiring 30b. As illustrated, the distance between the cut portions of the fuses increases when the second fuse window 150b is formed over the second sub-fuse line 100b as opposed to the first sub-fuse line 100a.

As exemplarily illustrated in FIG. 9, separate windows are defined to expose individual sub-fuse lines of the first and second fuse lines 90 and 100. It will be appreciated, however, that a single window may be defined to expose the sub-fuse lines of the first fuse line and the second fuses line, enabling both the first sub-fuse line 90a of the first fuse line 90 and the second sub-fuse line 100b of the second fuse line 100 to be cut. In this manner, when the first and second fuse lines 90 and 100 are cut, a bridge connecting neighboring fuse lines by scattered deposits remaining on the sub-fuse lines can be avoided.

Figure 10:
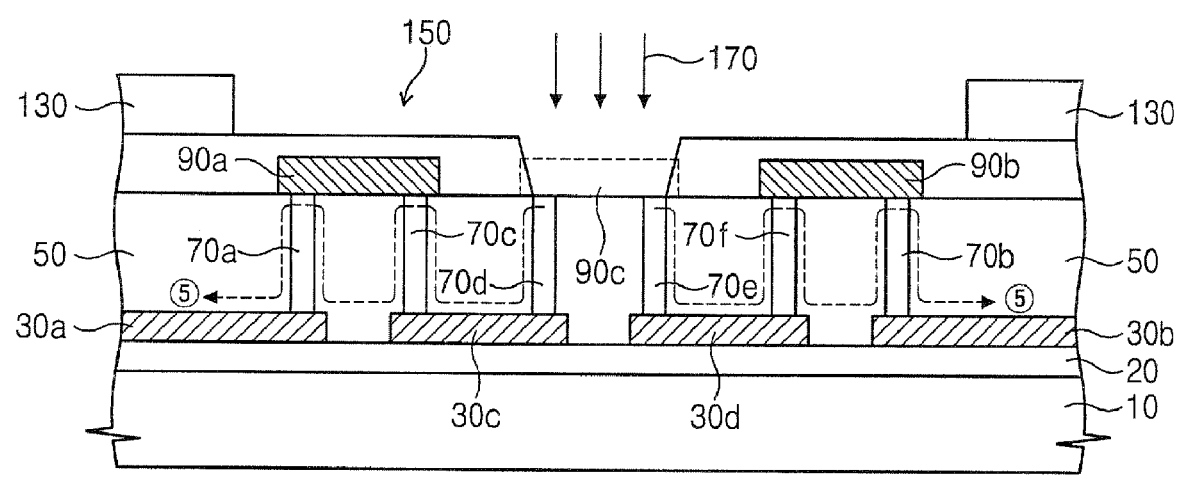
FIG. 10 is a sectional view showing a fuse cutting method of the fuse box in FIG. 9.
Figure 11:
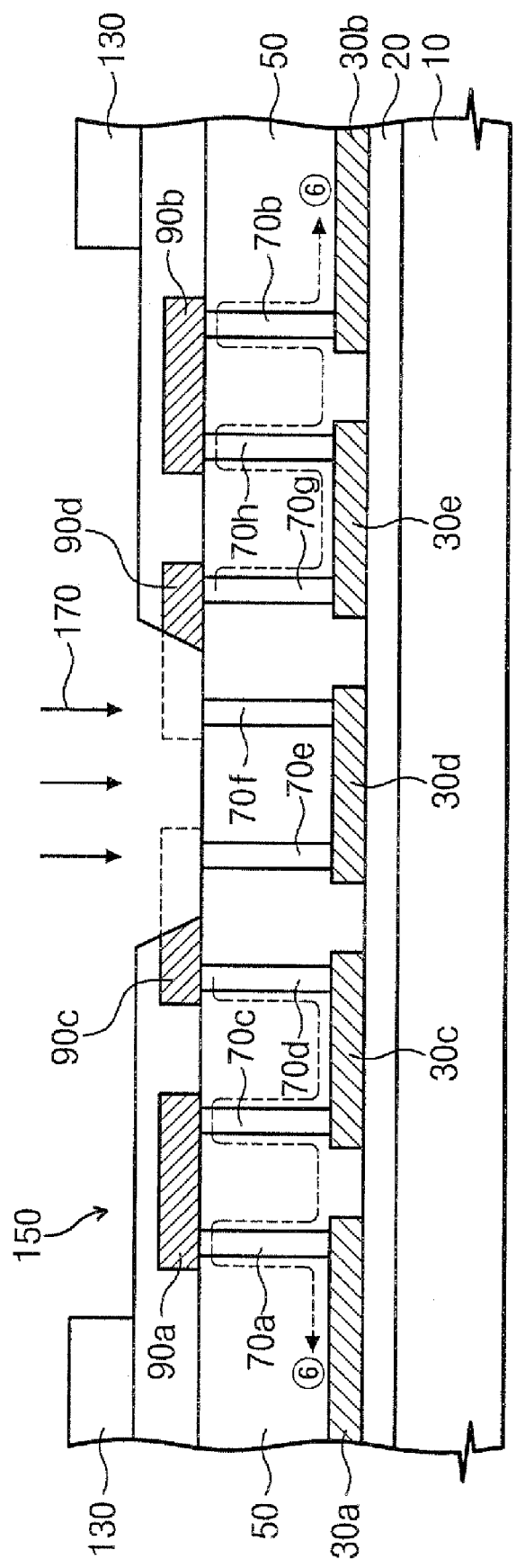
FIG. 11 is a sectional view showing another fuse cutting method of the fuse box in FIG. 9.

FIGS. 10 and 11 illustrate sectional views of other embodiments of fuse boxes and associated fuse cutting methods.

Referring to the embodiment exemplarily illustrated in FIG. 10, a fuse line 90 may include first to third sub-fuse lines 90a-90c, respectively. The first and third sub-fuse lines 90a and 90c may be electrically connected to each other by connecting pattern 30c and the second and third sub-fuse lines 90b and 90c may be electrically connected to each other by connecting pattern 30d. For example, the first and third sub-fuse lines 90a and 90c are electrically connected to the connecting pattern 30c through conductors 70c and 70d and the second and third sub-fuse lines 90b and 90c are electrically connected to the connecting pattern 30d through conductors 70f and 70e. The fuse line 90 may be cut by, for example, cutting the third sub-fuse line 90c with a laser beam 170. The first and second sub-fuse lines 90a and 90b that are not cut are protected by the third interlayer insulating layer 50 and are thus sealed from moisture. Moisture passages ⑤ formed as a result of the cutting extend away from the third sub-fuse line to create favorable conditions for blocking moisture. In another embodiment, the fuse line 90 may be cut by cutting the first or second sub-fuse lines 90a or 90b. Thus, the fuse box shown in FIG. 10 allows fuse lines to be cut more efficiently as compared with the fuse box shown in FIGS. 1-5.

Referring to the embodiment exemplarily illustrated in FIG. 11, a fuse line 90 may include first to fourth sub-fuse lines 90a-90d, respectively. The first and third sub-fuse lines 90a and 90c may be electrically connected to each other by connecting pattern 30c, the third and fourth sub-fuse lines 90c and 90d may be electrically connected to each other by connecting pattern 30d, and the fourth and second sub-fuse lines 90d and 90b may be electrically connected to each other by connecting pattern 30e. For example, the first and third sub-fuse lines 90a and 90c are electrically connected to the connecting pattern 30c through conductors 70c and 70d, the third and fourth sub-fuse lines 90c and 90d are electrically connected to the connecting pattern 30d through conductors 70e and 70f, and the fourth and second sub-fuse lines 90d and 90b are electrically connected to the connecting pattern 30e through conductors 70g and 70h. The fuse line 90 may be cut by, for example, simultaneously cutting the third and fourth sub-fuse lines 90c and 90d with a laser beam 170. Moisture passages ⑥ formed as a result of the cutting are longer than moisture passages ⑤.

It will be appreciated that any of the fuse cutting methods shown in FIGS. 7 through 9 may also be applied to the fuse boxes shown in FIGS. 10 and 11. That is, fuse cutting may be implemented in sequence in three or four fuse regions, and diagonally arranged sub-fuse lines of the neighboring fuse lines may be selectively cut.

The fuse box and the associated fuse cutting methods exemplarily described herein can greatly increase fuse repairing yield of a semiconductor device by preventing cracks, formations of bridges between proximal fuse lines, absorption of moisture, and cutting defects.

It will be apparent to those skilled in the art that various modifications and variations of the embodiments exemplarily described above can be made. Thus, it is intended that the claimed invention covers the modifications and variations of the disclosed embodiments provided they come within the scope of the appended claims and their equivalents.

What is claimed is:

1. A fuse box comprising:
    a first wiring and a second wiring formed on a substrate;
    at least one connecting pattern formed on the substrate; and
    a fuse line connecting the first wiring and the second wiring, the fuse line comprising a plurality of sub-fuse lines spaced apart from each other and electrically connected to each other by the at least one connecting pattern.

2. The fuse box of claim 1, further comprising:
    a lower interlayer insulating layer formed on the substrate; and
    a plurality of conductors passing through the lower interlayer insulating layer, wherein the plurality of conductors electrically connect the first and second wirings to the sub-fuse lines and the at least one connecting pattern to the sub-fuse lines.

3. The fuse box of claim 1, further comprising a passivation layer over the fuse line, the passivation layer having at least one fuse window defined therein, wherein the at least one fuse window exposes at least a portion of the fuse line.

4. The fuse box of claim 3, wherein the at least one fuse window comprises a fuse window exposing a plurality of sub-fuse lines.

5. The fuse box of claim 3, wherein the at least one fuse window comprises a fuse window having a width greater than a length of the fuse line.

6. The fuse box of claim 3, wherein the at least one fuse window comprises a plurality fuse windows each exposing at least one sub-fuse line.

7. The fuse box of claim 3, wherein the fuse line comprises a plurality of fuse lines, wherein the at least one fuse window comprises a fuse window at least partially exposing adjacent ones of the plurality of fuse lines.

8. The fuse box of claim 3, wherein the fuse line comprises a plurality of fuse lines, wherein the at least one fuse window comprises a plurality of fuse windows each at least partially exposing different ones of the plurality of fuse lines.

9. The fuse box of claim 8, wherein the plurality of fuse windows are arranged diagonally within the passivation layer.

10. A method of forming a fuse box, comprising:
    forming a first wiring and a second wiring on a substrate;
    forming at least one connecting pattern on the substrate; and
    forming a fuse line connecting the first wiring and the second wiring, the fuse line comprising a plurality of sub-fuse lines spaced apart from each other and electrically connected to each other by the at least one connecting pattern.

11. The method of claim 10, further comprising:
    forming a lower interlayer insulating layer formed on the substrate; and
    forming a plurality of conductors through the lower interlayer insulating layer, wherein the plurality of conductors electrically connect the first and second wirings to the sub-fuse lines and the at least one connecting pattern to the sub-fuse lines.

12. The method of claim 10, further comprising:
    forming a passivation layer on the fuse line; and
    patterning the passivation layer to form at least one fuse window exposing at least a portion of the fuse line.

13. The method of claim 12, wherein patterning the passivation layer comprises forming a fuse window exposing a plurality of sub-fuse lines.

14. The method of claim 12, wherein patterning the passivation layer comprises forming a fuse window having a width greater than a length of the fuse line.

15. The method of claim 12, wherein patterning the passivation layer comprises forming a plurality of fuse windows each exposing at least one sub-fuse line.

16. The method of claim 12, wherein the fuse line comprises a plurality of fuse lines, wherein patterning the passivation layer comprises forming a fuse window at least partially exposing adjacent ones of the plurality of fuse lines.

17. The method of claim 16, wherein forming a fuse line comprises forming a plurality of fuse lines, wherein patterning the passivation layer comprises forming a plurality of fuse windows each at least partially exposing different ones of the plurality of fuse lines.

18. The method of claim 17, further comprising patterning the passivation layer to form a plurality of fuse windows diagonally arranged therein.

* * * * *